US011853682B2

(12) United States Patent
Rittman et al.

(10) Patent No.: US 11,853,682 B2
(45) Date of Patent: Dec. 26, 2023

(54) SYSTEMS AND METHODS FOR IDENTIFICATION AND ELIMINATION OF GEOMETRICAL DESIGN RULE VIOLATIONS OF A MASK LAYOUT BLOCK

(71) Applicant: GBT Technologies Inc., Santa Monica, CA (US)

(72) Inventors: Danny Rittman, San Diego, CA (US); Mo Jacob, Beverly Hills, CA (US)

(73) Assignee: GBT Tokenize Corp., Santa Monica, CA (US)

( * ) Notice: Subject to any disclaimer, the term of this patent is extended or adjusted under 35 U.S.C. 154(b) by 0 days.

(21) Appl. No.: 17/391,292

(22) Filed: Aug. 2, 2021

(65) Prior Publication Data

US 2022/0390831 A1   Dec. 8, 2022

Related U.S. Application Data

(60) Provisional application No. 63/197,635, filed on Jun. 7, 2021.

(51) Int. Cl.
| | |
|---|---|
| *G06F 30/398* | (2020.01) |
| *G03F 1/70* | (2012.01) |
| *G06F 30/31* | (2020.01) |

(52) U.S. Cl.
CPC .............. *G06F 30/398* (2020.01); *G03F 1/70* (2013.01); *G06F 30/31* (2020.01)

(58) Field of Classification Search
CPC .................................................... G06F 30/398
USPC ......................................................... 716/52
See application file for complete search history.

(56) References Cited

U.S. PATENT DOCUMENTS

| | | | |
|---|---|---|---|
| 5,541,025 | A | 7/1996 | Oi et al. |
| 5,761,075 | A | 6/1998 | Oi et al. |
| 6,457,163 | B1 | 9/2002 | Yang |
| 6,782,517 | B2 | 8/2004 | Rittman et al. |
| 6,782,524 | B2 | 8/2004 | Rittman |
| 6,904,582 | B1 | 6/2005 | Rittman et al. |
| 6,978,437 | B1 | 12/2005 | Rittman et al. |
| 7,178,114 | B2 | 2/2007 | Lin et al. |

(Continued)

OTHER PUBLICATIONS

U.S. Appl. No. 17/315,747, Rittman et al.

*Primary Examiner* — Eric D Lee
(74) *Attorney, Agent, or Firm* — Eric L. Lane; Green Patent Law

(57) ABSTRACT

Computer-implemented systems and methods for eliminating geometrical design rule violations, maintaining mask layout electrical connectivity, reliability verification, and design for manufacturing structural correctness of a mask layout block are provided. Exemplary systems and methods include comparing a feature dimension in a mask layout data file with a design rule in a reference rule file and identifying a design rule violation of a mask layout block if the feature dimension does not match the design rule. Methods may further include automatically correcting the design rule violation by modifying the feature dimension so the feature dimension matches the design rule. A design rule autocorrection tool may be provided and be configured to compare a feature dimension in a mask layout data file with a design rule in a reference rule file and correct the design rule violation. Disclosed embodiments advantageously correct all design rules including dependency rules.

22 Claims, 16 Drawing Sheets

(56) References Cited

U.S. PATENT DOCUMENTS

| | | |
|---|---|---|
| 7,519,940 B2 | 4/2009 | Huang et al. |
| 7,537,864 B2 | 5/2009 | Fujimoto et al. |
| 7,568,174 B2 | 7/2009 | Sezginer et al. |
| 7,600,212 B2 | 10/2009 | Zach et al. |
| 7,849,423 B1 | 12/2010 | Yenikaya et al. |
| 8,572,517 B2 | 10/2013 | Pramanik et al. |
| 8,940,462 B2 | 1/2015 | Hashimoto et al. |
| 9,292,627 B2 | 3/2016 | Pramanik et al. |
| 9,372,855 B1 | 6/2016 | Lee et al. |
| 9,836,556 B2 | 12/2017 | Lei et al. |
| 10,755,026 B1 * | 8/2020 | Luo .................... G06F 30/27 |
| 2002/0144230 A1 | 10/2002 | Rittman |
| 2002/0152453 A1 | 10/2002 | Rittman |
| 2002/0166109 A1 * | 11/2002 | Rittman .............. G06F 30/398 |
| | | 257/734 |
| 2005/0005256 A1 | 1/2005 | Rittman |
| 2005/0022151 A1 | 1/2005 | Rittman et al. |
| 2005/0142454 A1 | 6/2005 | Fujimoto et al. |
| 2007/0289207 A1 | 12/2007 | May |
| 2008/0086708 A1 | 4/2008 | Rittman |
| 2008/0086709 A1 | 4/2008 | Rittman |
| 2008/0115102 A1 | 5/2008 | Rittman |
| 2008/0134129 A1 | 6/2008 | Vickery |
| 2009/0031264 A1 | 1/2009 | Rittman |
| 2011/0229807 A1 | 9/2011 | Hashimoto et al. |
| 2015/0143318 A1 | 5/2015 | Gibson |
| 2021/0012054 A1 | 1/2021 | Adler |

* cited by examiner a - Enclosure
b - Space
c - Overlap
d - Width
e - Extension

DRC Auto-Correction Flow

SYSTEMS AND METHODS FOR IDENTIFICATION AND ELIMINATION OF GEOMETRICAL DESIGN RULE VIOLATIONS OF A MASK LAYOUT BLOCK

CROSS-REFERENCE TO RELATED APPLICATION

This application claims priority to U.S. patent application Ser. No. 63/197,635, filed Jun. 7, 2021, which is hereby incorporated by reference herein in its entirety.

FIELD

The present disclosure relates to systems and methods of eliminating geometrical design rule violations and maintaining mask layout electrical connectivity, reliability verification, and design for manufacturing structural correctness of a mask layout block.

BACKGROUND

A photomask is an opaque plate with holes or transparencies that allow light to shine through in a defined pattern. Photomasks are commonly used in photolithography and in the production of integrated circuits (ICs or "chips") in particular. Masks are used to produce a pattern on a substrate, normally a thin slice of silicon known as a wafer in the case of chip manufacturing. Several masks are used in turn, each one reproducing a layer of the completed design, and together they are known as a mask set.

A typical semiconductor design process includes numerous steps. Initially, a circuit designer prepares a schematic diagram that includes logical connections between logic elements that together form an integrated circuit. The schematic diagram is then tested to verify that the logic elements and associated logical connections perform a desired function. Once the circuit is verified, the schematic diagram is converted into a mask layout database that includes a series of polygons. The polygons may represent the logic elements and the logical connections contained in the schematic diagram. The mask layout database is then converted into multiple photomasks, also known as masks or reticles, that may be used to image different layers of the integrated circuit on to a semiconductor wafer.

Over the past several years, the number of transistors in a semiconductor device has increased dramatically. Due to this increase, the time to design and manufacture semiconductor devices also has increased. As the number of transistors on an integrated circuit continues to increase, and the design process for the integrated circuit becomes more complex, it is more challenging to correct geometrical design rules. For example, an increasing number of transistors or a FinFet process may require additional layers and physics-oriented rules to form the integrated circuit on a semiconductor wafer. Each layer associated with the integrated circuit may include a complex design rule for the layer in a desired manufacturing process. The number of design rules for the desired manufacturing process, therefore, significantly increases as the number of layers increase and advanced physics-oriented phenomenon formed on the semiconductor wafer.

Typically, the mask layout database is created manually by a layout designer or automatically by a synthesis tool. Once the mask layout database is complete, spacing between the polygons on the same layer is compared to the minimum allowable spacing that is included in a technology file for a desired manufacturing process. This comparison may identify design rule violations if the spacing between the polygons or the dimensions of the polygons in the mask layout database is less than the corresponding minimum allowable design rule in the technology file.

Today, any design rule violations in the mask layout database are corrected manually by a layout designer. The layout designer typically finds each violation and manually corrects the violations by moving polygons associated with the violations. Especially with advanced chips (14 nm, 10 nm, 7 nm, 5 nm and below . . . ) there are many design rules that have dependencies. This is when it becomes a challenge to fix manually. The layout designer may move a polygon to a specific distance, but he/she has to consider other design rules that may be a dependency of this violation. Thus, during the correction process, the layout designer may create new design rule violations and, therefore, the correction process may need to be repeated until the mask layout database does not include any design rule violations. The process of iteratively correcting the design rule violations may take several hours, days or weeks to complete and can significantly increase the time needed to design the integrated circuit.

The additional time required to complete layout may also delay the production of a photomask set used to fabricate the integrated circuit. Especially with advanced nanometer processes the process's design rules are highly complex and depend on electrical and physical phenomena. A manual correction of these design rules can increase the overall integrated circuit's design by many months.

Accordingly, there is a need for an automatic system to correct design rules, maintaining the electrical connectivity (LVS) intact. In addition, there is a need for new systems and methods to eliminate geometrical design rule violations of a mask layout block and to correct such rule violations quickly. There is also a need for systems and methods of maintaining mask layout electrical connectivity, reliability verification, and design for manufacturing structural correctness of a mask layout block. There is a need for systems and methods that can consider and fix all design rule violations, including dependencies rules that need to be covered.

SUMMARY

The present disclosure, in its many embodiments, alleviates to a great extent the disadvantages and problems associated with eliminating design rule violations on a photomask. In disclosed embodiments, a photomask is formed by using a mask pattern file created by automatically correcting a design rule violation in a mask layout file. In accordance with an exemplary embodiment, a photomask includes a patterned layer formed on at least a portion of a substrate. The patterned layer may be formed using a mask pattern file that is created by comparing a feature dimension in a mask layout file with a design rule in a technology file. If the feature dimension is less or greater than the design rule, a design rule violation is identified and automatically corrected in the mask layout file.

In accordance with another exemplary embodiment, an integrated circuit includes a plurality of interconnect layers, of all types, and a plurality of contact layers that provide electrical connections between the respective interconnect layers. The interconnect and contact layers may be formed using a plurality of photomasks that are created by comparing a feature dimension in a mask layout file with a design rule in a technology file. If the feature dimension is less than the design rule, a design rule violation is identified and automatically corrected in the mask layout file. A plurality of mask pattern files that correspond to the interconnect and contact layers are generated from the mask layout file.

Important technical advantages of exemplary embodiments include a design rule auto-correction (DRAC) tool that reduces the design time for an integrated circuit. A design rule check (DRC) tool checks a mask layout file for design rule violations and identifies any violations in an output file. If the mask layout file contains design rule violations, the DRAC tool reads the coordinates of the violation from the output file and automatically adjusts a feature dimension associated with the violation until the feature dimension is equal, greater, or less than the defined design rule for a desired manufacturing process. The time needed to verify the mask layout file may be substantially reduced because the DRAC tool simultaneously identifies and eliminates the design rule violations in the mask layout file.

Another important technical advantage of exemplary embodiments includes a DRAC tool that reduces the size and increases the density of features in a mask layout file. In addition to correcting design rule violations, the DRAC tool determines if the spacing between polygons in the mask layout file is greater than the corresponding minimum design rules in a technology file and reduces the spacing until it is approximately equal to the minimum design rule. The density of the mask layout file, therefore, may be increased, which also increases the number of integrated circuits that may be fabricated on a wafer, which is defined as a silicon yield enhancement. The system also provides an Advise Mode. In this mode user can review the found violations individually and/or by category and decides if he/she would like to Auto-Correct them or not.

Exemplary systems and methods are based on an artificial intelligence convolutional neural network. The convolutional neural network (CNN) is a class of deep neural network, here applied to analyze the mask layout graphical data. The CNN reads the mask layout data file in the format of GDSII, or Oasis (GDS III), CIF or layout editor native data and analyzes all mask layout layers. The system learns the structure and layers dependencies from the design rule deck, then checks the mask layout data. The system uses successive approximation heuristics and additional methods to significantly shorten the analysis time. This is especially crucial with modern integrated circuits that are represented by huge data.

An exemplary computer-implemented method of eliminating geometrical design rule violations of a mask layout block comprises comparing a feature dimension in a mask layout data file with a design rule in a reference rule file and identifying a design rule violation of a mask layout block if the feature dimension does not match the design rule. The method may further include automatically correcting the design rule violation by modifying the feature dimension so the feature dimension matches the design rule. In exemplary embodiments, identifying a design rule violation comprises determining that the feature dimension in the mask layout data file is greater or smaller than the design rule in the reference rule file. The design rule may comprise a Voltage-Aware design rule, a DFM-Aware design rule, and/or an RV-Aware design rule.

The step of modifying the feature dimension so the feature dimension matches the design rule may comprise adjusting the feature dimension until the feature dimension is exactly equal to the design rule. The step of automatically correcting the design rule violation in the mask layout data file may comprise correcting all design rules including dependency rules. Automatically correcting the design rule violation also may include repositioning edges of one or more polygons in the mask layout data file until the feature dimension is equal to the design rule. Exemplary methods further comprise presenting the design rule violation graphically as one or more violation markers. The design rule violation may be a hierarchical design rule violation in a sub-cell of the mask layout data file. Exemplary methods further comprise generating a clean mask layout data file without any design rule violations.

Exemplary embodiments include systems for maintaining mask layout electrical connectivity, reliability verification, and design for manufacturing structural correctness of a mask layout block. Such systems comprise a design rule auto-correction tool configured to compare a feature dimension in a mask layout data file with a design rule in a reference rule file. If the feature dimension does not match the design rule, the design rule auto-correction tool identifies a design rule violation and automatically corrects the design rule violation by modifying the feature dimension such that the feature dimension matches the design rule.

In exemplary embodiments, the design rule auto-correction tool reduces size and increases density of features in the mask layout data file. The design rule auto-correction tool determines if spacing between polygons in the mask layout data file is greater than spacing in a minimum design rule and is configured to reduce the spacing between polygons until the spacing is equal to the spacing in the minimum design rule. In exemplary embodiments, the design rule auto-correction tool considers multiple patterning and automatically corrects all design rule violations on multiple layers of an integrated circuit.

The design rule auto-correction tool may include a convolutional neural network, and the convolutional neural network performs deep learning of the mask layout data file. In exemplary embodiments, the convolutional neural network compares the feature dimension in the mask layout data file with the design rule in the reference rule file, identifies the design rule violation, and automatically corrects the design rule violation. Exemplary systems further comprise a violation browser displaying the design rule violation.

An exemplary method of analyzing an integrated circuit mask layout data file and a reference rule file comprises reading a mask layout data file, reading a reference rule file, comparing a feature dimension in the mask layout data file with a design rule in the reference rule file, and identifying a design rule violation in the mask layout data file if the feature dimension does not match the design rule. Methods may further comprise determining the coordinates of the design rule violation in the mask layout data file and automatically correcting the design rule violation by modifying the feature dimension so the feature dimension matches the design rule.

Methods may further comprise analyzing interconnecting layers of a plurality of mask layout blocks where the interconnecting layers include a top-level block or cell and one or more sub-blocks or sub-cells. In exemplary embodiments, identifying a design rule violation in the mask layout data file comprises identifying a design rule violation in one or more of the top-level cell or the one or more sub-cells and automatically correcting the design rule violation comprises automatically correcting the design rule violation in one or more of the top-level cell or the one or more sub-cells.

In exemplary embodiments, modifying the feature dimension so the feature dimension matches the design rule comprises adjusting the feature dimension until the feature dimension is greater than or equal to the design rule. The reading, comparing, identifying, determining, and automatically correcting steps may be performed incrementally on mask layout data that has changed since a previous run. Exemplary methods support FinFet manufacturing process rules and support digital, analog, analog-mixed signal design, and MEMs mask layout types.

Disclosed embodiments are especially useful with advanced nanometer chips in processes like 7 nm, 5 nm, 3 nm and below, where each geometrical design rule has dependencies with other rules. For example, if there is too short a distance between 2 METAL1 layers, and the designer is manually moving one METAL 1 polygon farther, it may cause a short distance to other METAL 1 polygons. Furthermore, this move may trigger other geometrical design rules violations with other layers. Thus, every manual correction of one or more design rule(s) most likely causes many other violations. That is why in advanced processes it is such a time-consuming process. It is a tedious process that typically is done manually and can take days or weeks. But disclosed embodiments do it in minutes. Given the fact that in an advanced microchip there are billions of transistors, disclosed embodiments can save 50% or more of the global chip's design time.

Accordingly, it is seen that systems and methods of eliminating geometrical design rule violations and maintaining mask layout electrical connectivity, reliability verification, and design for manufacturing structural correctness of a mask layout block are provided. These and other features of the disclosed embodiments will be appreciated from review of the following detailed description, along with the accompanying figures in which like reference numbers refer to like parts throughout.

BRIEF DESCRIPTION OF THE DRAWINGS

The foregoing and other objects of the disclosure will be apparent upon consideration of the following detailed description, taken in conjunction with the accompanying drawings, in which.

DETAILED DESCRIPTION

In the following paragraphs, embodiments will be described in detail by way of example with reference to the accompanying drawings, which are not drawn to scale, and the illustrated components are not necessarily drawn proportionately to one another. Throughout this description, the embodiments and examples shown should be considered as exemplars, rather than as limitations of the present disclosure.

As used herein, the "present disclosure" refers to any one of the embodiments described herein, and any equivalents. Furthermore, reference to various aspects of the disclosure throughout this document does not mean that all claimed embodiments or methods must include the referenced aspects. Reference to materials, configurations, directions, and other parameters should be considered as representative and illustrative of the capabilities of exemplary embodiments, and embodiments can operate with a wide variety of such parameters. It should be noted that the figures do not show every piece of equipment, nor the materials, configurations, and directions of the various circuits and communications systems.

Exemplary embodiments include systems and methods for automatic elimination of geometrical design rule (DRCs) violations of a mask layout block, maintaining the electrical connectivity (LVS), reliability constraints (RV) and design for manufacturing (DFM) structural correctness. Disclosed embodiments analyze an integrated circuit layout block and identify geometrical design rule violations. If a feature dimension does not match a rule deck reference rule disclosed systems and methods automatically correct the identified design rule violation in the mask layout data. The automatic correction maintains the integrated circuit mask layout electrical connectivity (LVS), reliability verification (RV) and Design for Manufacturing (DFM) correctness.

Exemplary embodiments modify, move, delete or/and re-create mask layout polygons to correct manufacturing process design rule violations. The systems and methods work on individual polygons and hierarchical assembly which includes top level block and sub-blocks. Exemplary embodiments use artificial intelligence technology in the form of convolutional neural networks (CNN) for deep learning of the IC layout structure, analysis, and automatic correction. A convolutional neural network provides the analysis in conjunction with geometrical correction methods.

Figure 1A:
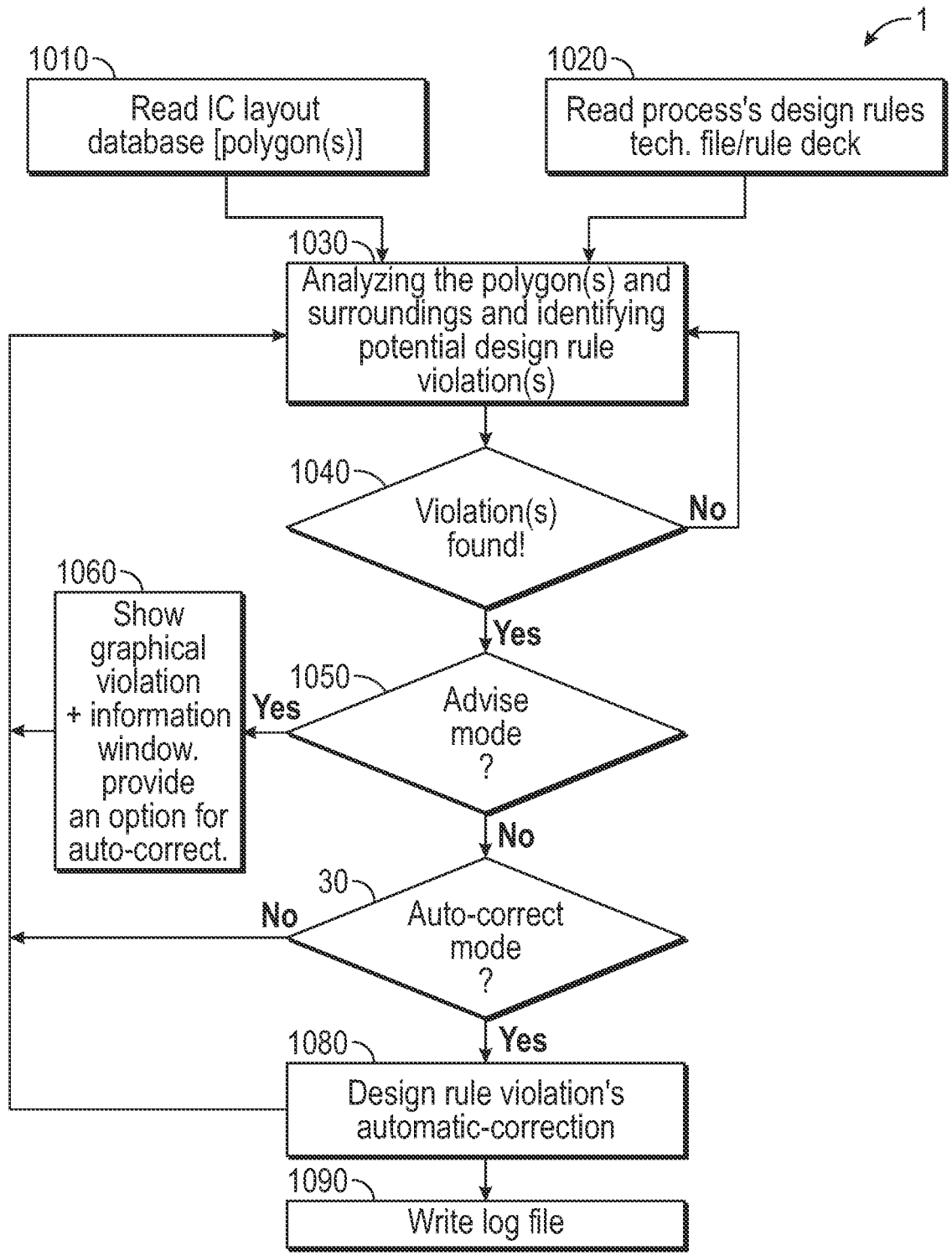
FIG. 1A is a process flow diagram showing an exemplary embodiment of a method of eliminating geometrical design rule violations of a mask layout block in accordance with the present disclosure.
Figure 1B:
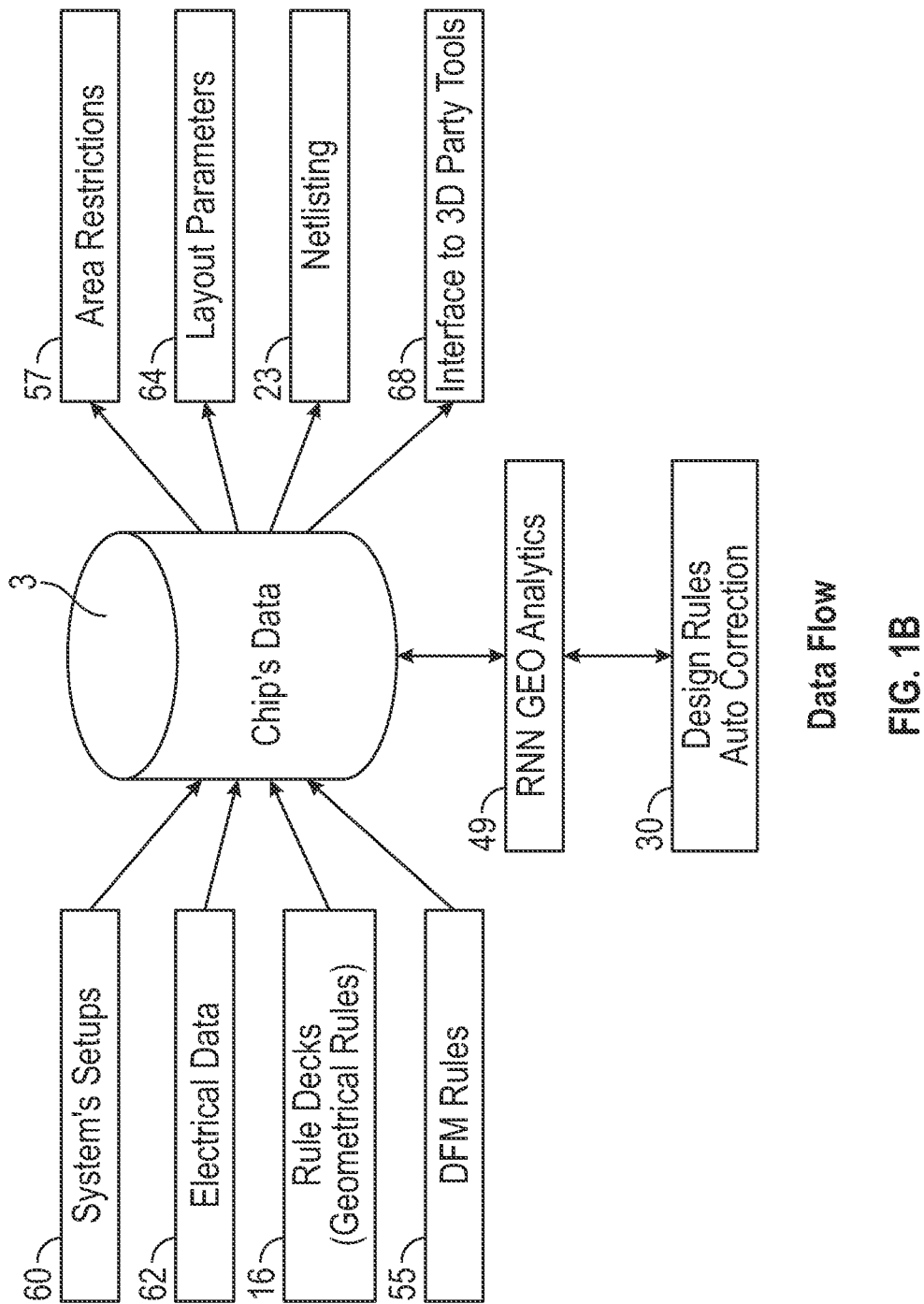
FIG. 1B is a schematic showing an exemplary embodiment of a system of eliminating geometrical design rule violations of a mask layout block in accordance with the present disclosure.

Referring to FIGS. 1A and 1B, an exemplary computer-implemented method 1 of eliminating geometrical design rule violations of a mask layout block 3 and corresponding system 2 will now be described. An initial step of the method 1 is to read 1010 an integrated circuit mask layout database file 10. One or more feature dimensions 12, e.g., polygons or other shapes, are analyzed 1030. Exemplary embodiments read 1010 the mask layout database file 10 in GDS II or GDS III (Oasis), or CIF or mask layout editor native environment data file. The method also includes reading 1020 a design rule 14 in a reference rule file 16. Then the feature dimension 12 in the mask layout database file 10 is compared to the design rule 14. If there is a photomask design rule violation 18, it is identified 1040 and the coordinates of the design rule violation(s) are determined. A design rule violation 18 would occur if the feature dimension 12 does not match the design rule 14 in the reference rule file 16. Such a mismatch could arise if the feature dimension 12 in the mask layout data file 10 is greater or smaller than the design rule 14.

As best seen in FIG. 1B, various sources serve as inputs to the chip data for the mask layout block 3. System setups 60 and electrical data 62 may be part of the chip data. As discussed above and in more detail herein, the chip data also is comprised of reference rule file 16 information and DFM guidelines 55. The chip data for the mask layout block 3 communicates certain area restrictions 57, layout parameters 64. In exemplary embodiments, outputs include netlisting 23 and an interface 68 to third party tools. As discussed in more detail herein, a recurrent neural network 45 may perform geo analytics 49 as part of the design rule auto-correction 30.

Disclosed methods and systems support any type of design rule. For example, Voltage-Aware DRC are supported. Voltage Aware Design Rules relate to physical distance, enclosure, or any feature dimension that is dependent on the electric potential difference between the objects (Voltage). In addition, systems and methods support DFM-Aware DRC. Design for Manufacturing aware Design Rules means physical feature dimension between objects that is dependent on DFM rules. RV-Aware DRC are also supported. Reliability Verification aware Design Rules means physical feature dimension between objects that is dependent on reliability constraints like Electromigration, Self-Heat, IR Drop and other related rules.

In the event of a design rule violation 18, it may be automatically corrected 1080 by modifying the feature dimension 12 so it matches the design rule 14. In the case where the feature dimension 12 is greater or smaller than the design rule 14, the feature dimension 12 would be modified or adjusted until it is exactly equal to the design rule 14. In exemplary embodiments, automatically correcting the design rule violation 18 comprises repositioning edges 20 of violating polygons 112 in the mask layout data file 10 until the feature dimension is equal to the necessary design rule 14. The method could have an Advise Mode, in which the tool highlights the design rule violation 18 without correcting it, and an Auto-Correction Mode 30.

Figure 2A:
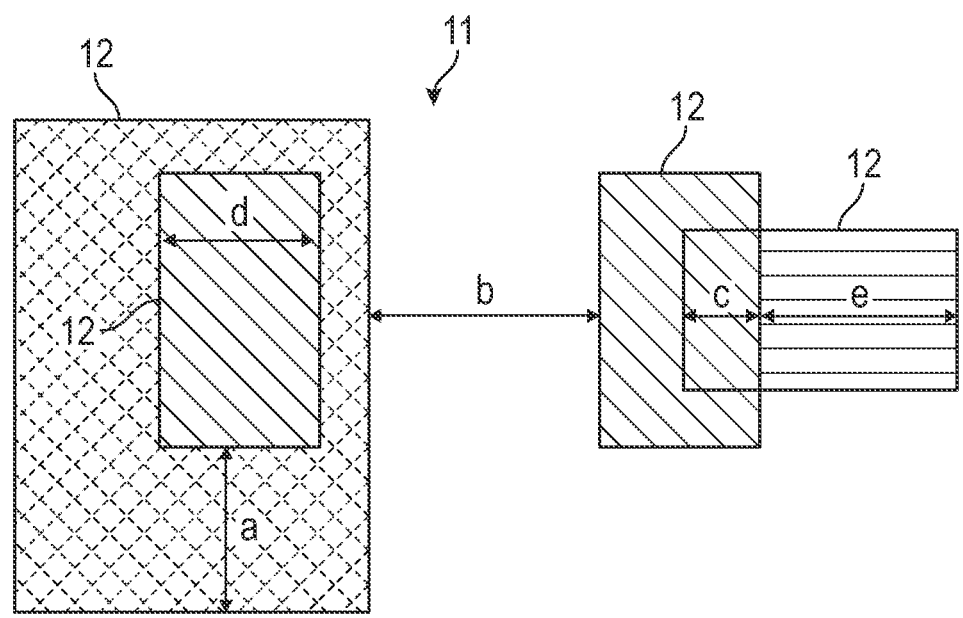
FIG. 2A is a schematic showing an exemplary embodiment of a photomask assembly in accordance with the present disclosure.
Figure 2B:
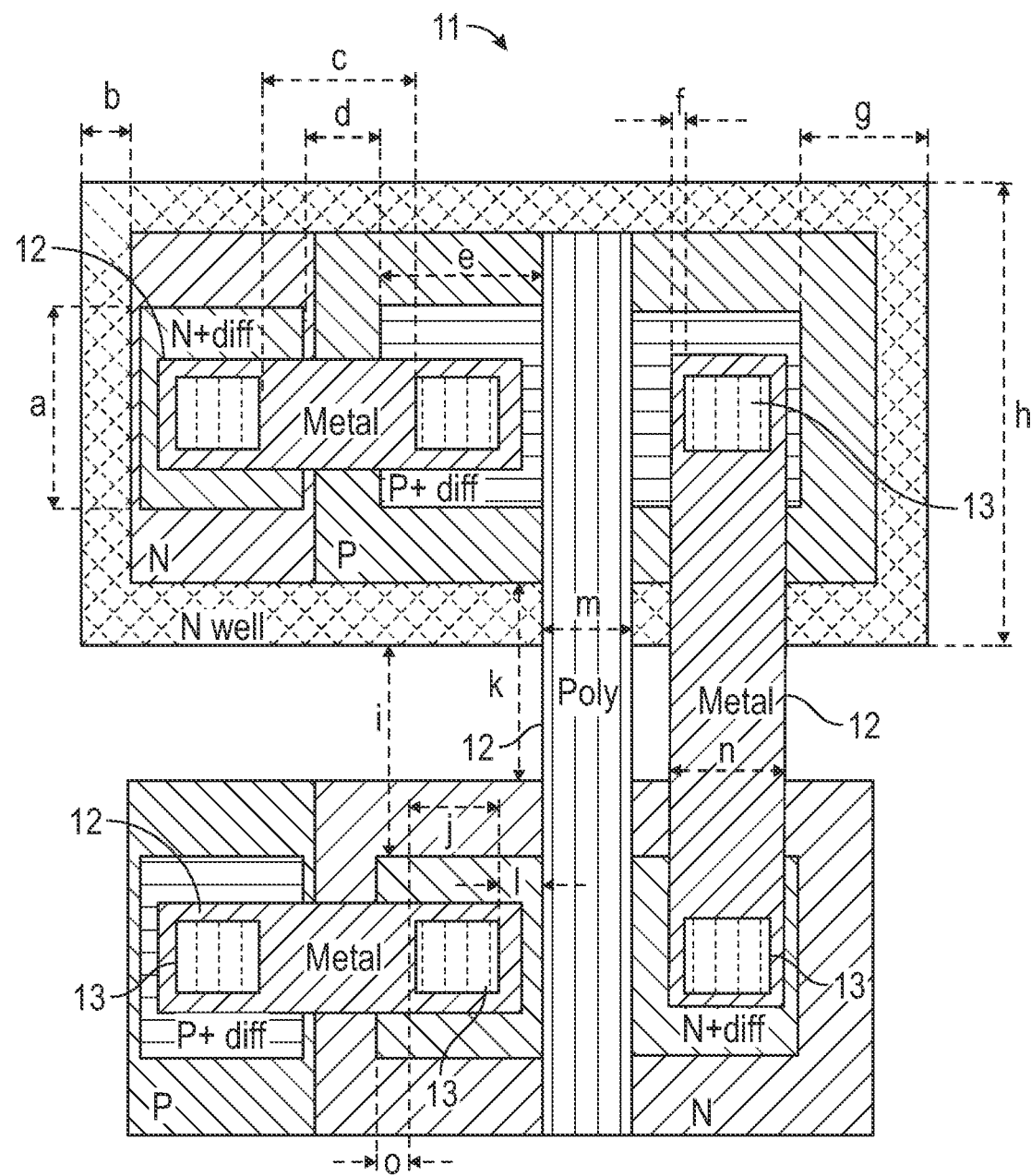
FIG. 2B is a schematic showing an exemplary embodiment of a photomask assembly in accordance with the present disclosure.

FIGS. 2A-5 illustrate how a design rule violation 18 could arise and how exemplary methods correct the violation. FIG. 2A shows exemplary parameters of a photomask assembly 11 such as an enclosure (a) formed by a first polygon 12 within a second polygon 12, a space (b) between two polygons 12, overlap (c) between two polygons 12, the width (d) of a polygon, and an extension (e) of a polygon 12 beyond another polygon 12. In FIG. 2B, a more complex photomask assembly 11 is shown with several metals or polygons 12 enclosing contacts 13 with multiple distances (a)-(n). When any of these distances is greater or less than specified in a design rule 14, then a design rule violation 18 occurs.

Figure 5:
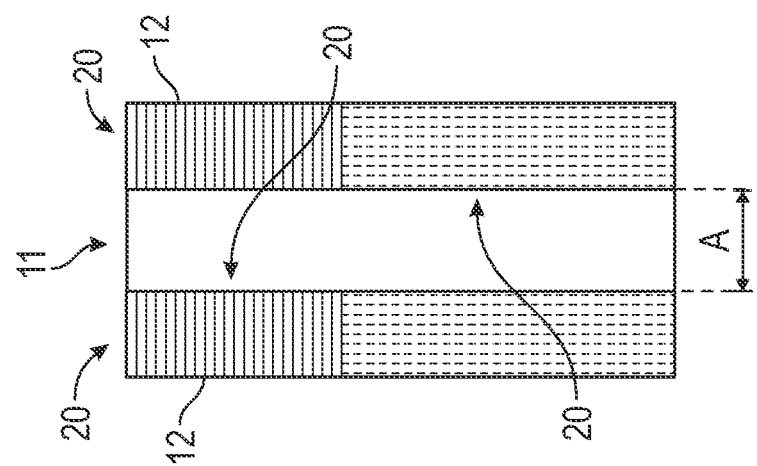
FIG. 5 is a cross-sectional view of an exemplary photomask assembly manufactured in accordance with exemplary methods of the present disclosure and showing correction of a design rule violation.
Figure 4:
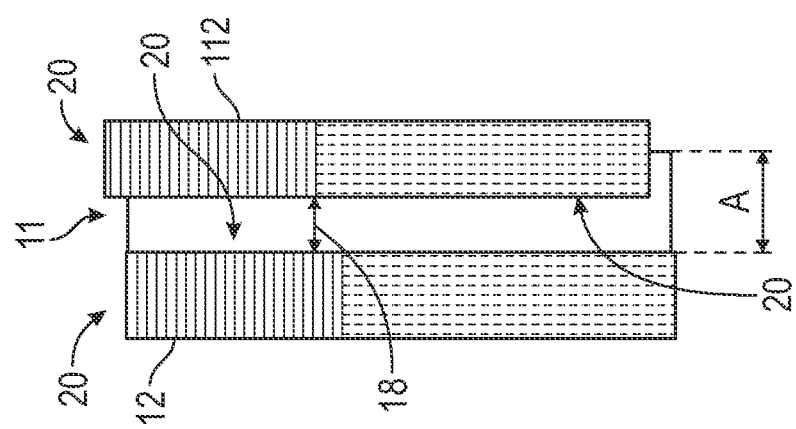
FIG. 4 is a cross-sectional view of an exemplary photomask assembly manufactured in accordance with exemplary methods of the present disclosure and showing a design rule violation.
Figure 3:
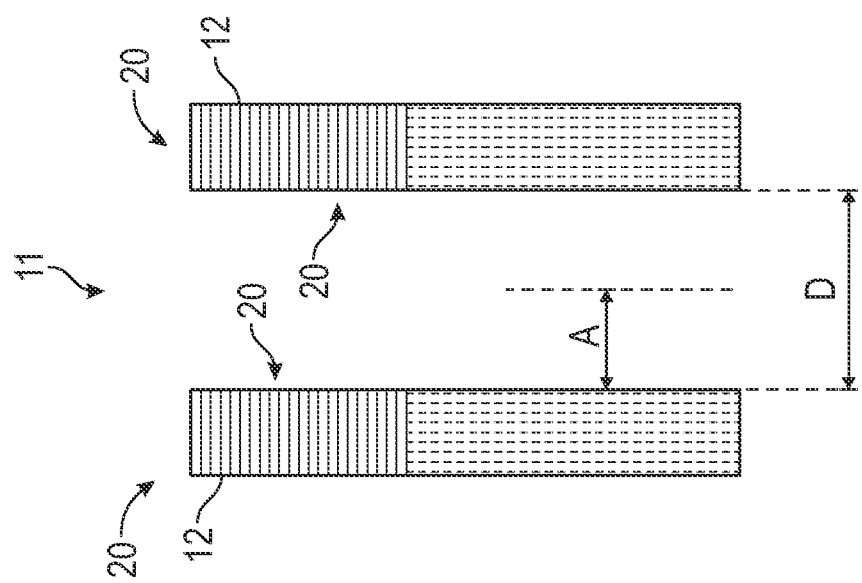
FIG. 3 is a cross-sectional view of an exemplary photomask assembly manufactured in accordance with exemplary methods of the present disclosure.

In the photomask assembly 11 shown in FIGS. 3-5, a minimum distance A is necessary to comply with the design rule deck. Distance D is not a violation since it is greater than distance A, but it is a waste of silicon space. To eliminate that waste, as shown in FIG. 4, a user moves one of the polygons 112, in an attempt to correct the design rule distance. Accidently, the user places the polygon 112 too close to the other Metal 1 polygon, creating a design rule violation 18 because the distance A is less than the minimum allowed by the design rule 14. FIG. 5 shows the mask layout after processing by disclosed systems and methods. The polygon 12 (formerly 112 when it was a violating polygon) is moved to a correct distance according to the design rule deck reference and the violation is fixed.

Figure 6:
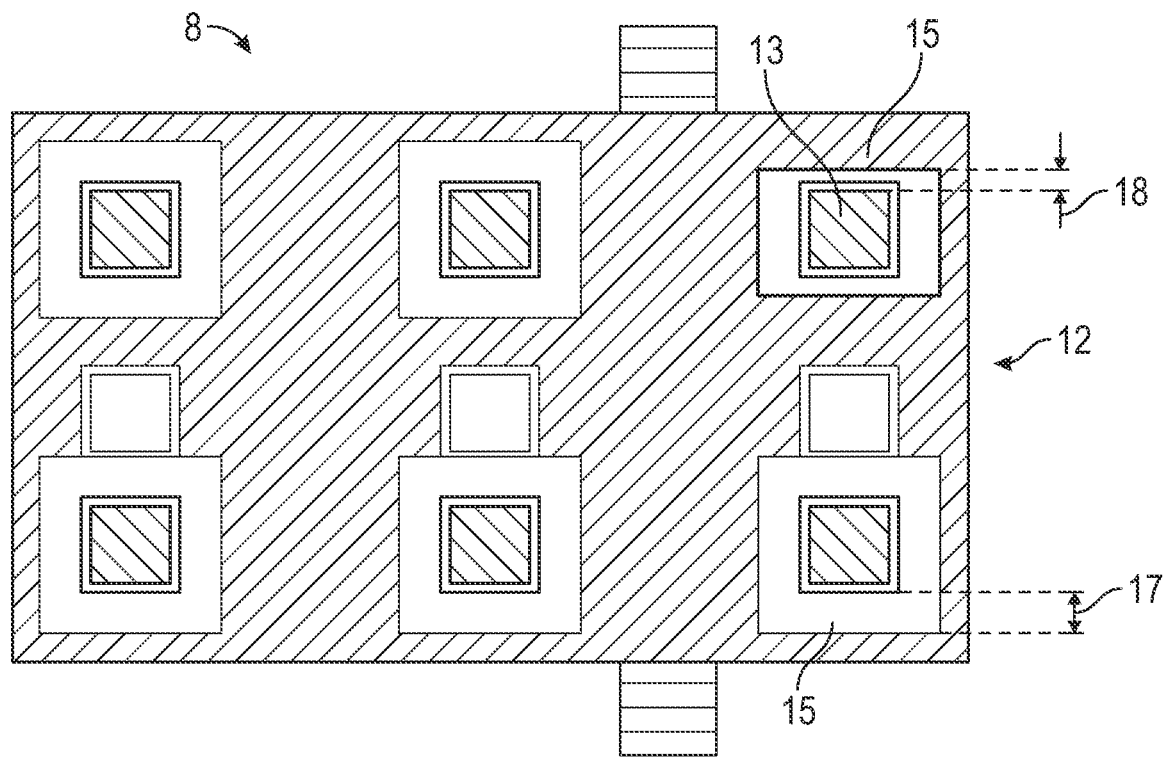
FIG. 6 is a layout view of an integrated circuit before an exemplary embodiment of a design rule auto-correction tool checks feature dimensions in a mask layout file.
Figure 7:
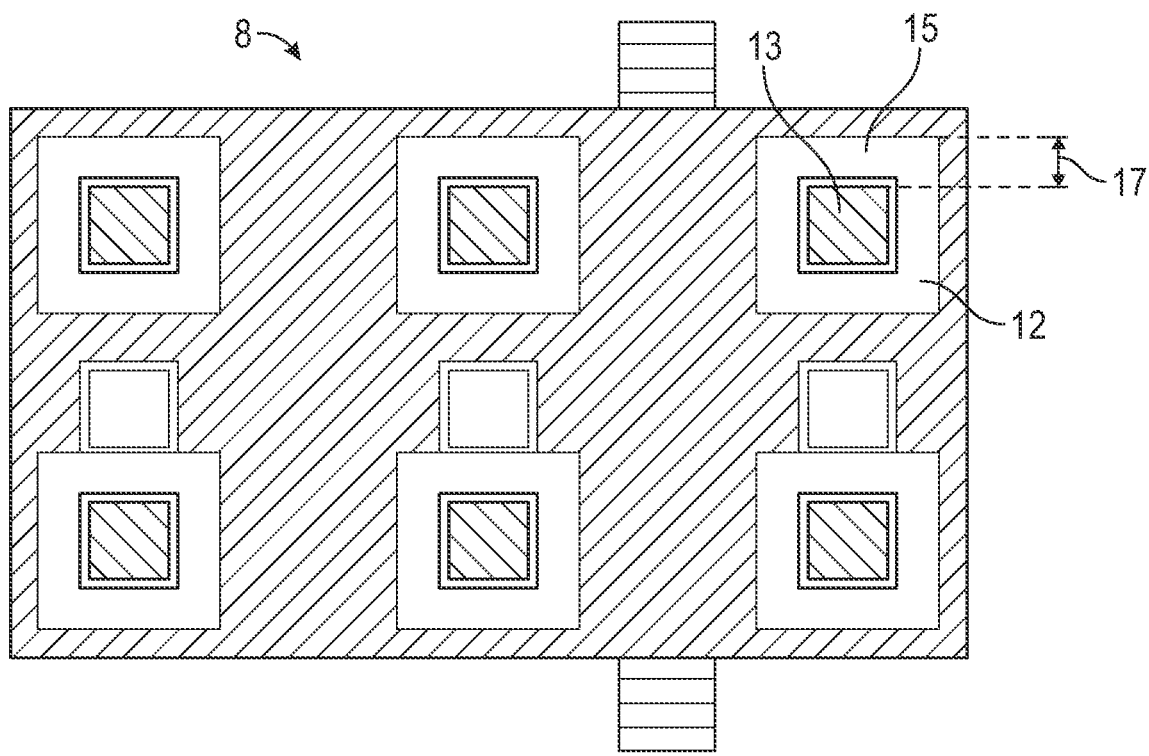
FIG. 7 is a layout view of an integrated circuit after an exemplary embodiment of a design rule auto-correction tool corrects design rule violations in a mask layout file.

FIGS. 6 and 7 illustrate another example of a design rule violation 18, i.e., an enclosure type violation. In this example, the Metal 1 Polygon 12 is enclosing the contact 13 with an enclosure 15 having less than the minimal enclosure distance 17, thereby creating a design rule violation 18 in an integrated circuit. FIG. 7 shows the mask layout after processing by disclosed methods and systems. The Metal 1 Polygon 12 is now enclosing contact 13 with the correct enclosure distance 17 according to the design rule 14 deck file reference.

Exemplary methods include checking and correcting a variety of rule types, including but not limited to, geometrical, electrical, and manufacturing design rules to maintain the mask layout data electrical connectivity (LVS—Layout vs Schematic) correctness, Design for Manufacturing (DFM) rules, and reliability (RV—Reliability verification) correctness. After correcting all design rule violations 18, a clean mask layout data file without any design rule violations would be generated 1090. The clean mask layout data file may be generated in GDSII or GDS III (Oasis), CIF or native mask layout editor.

Figure 8:
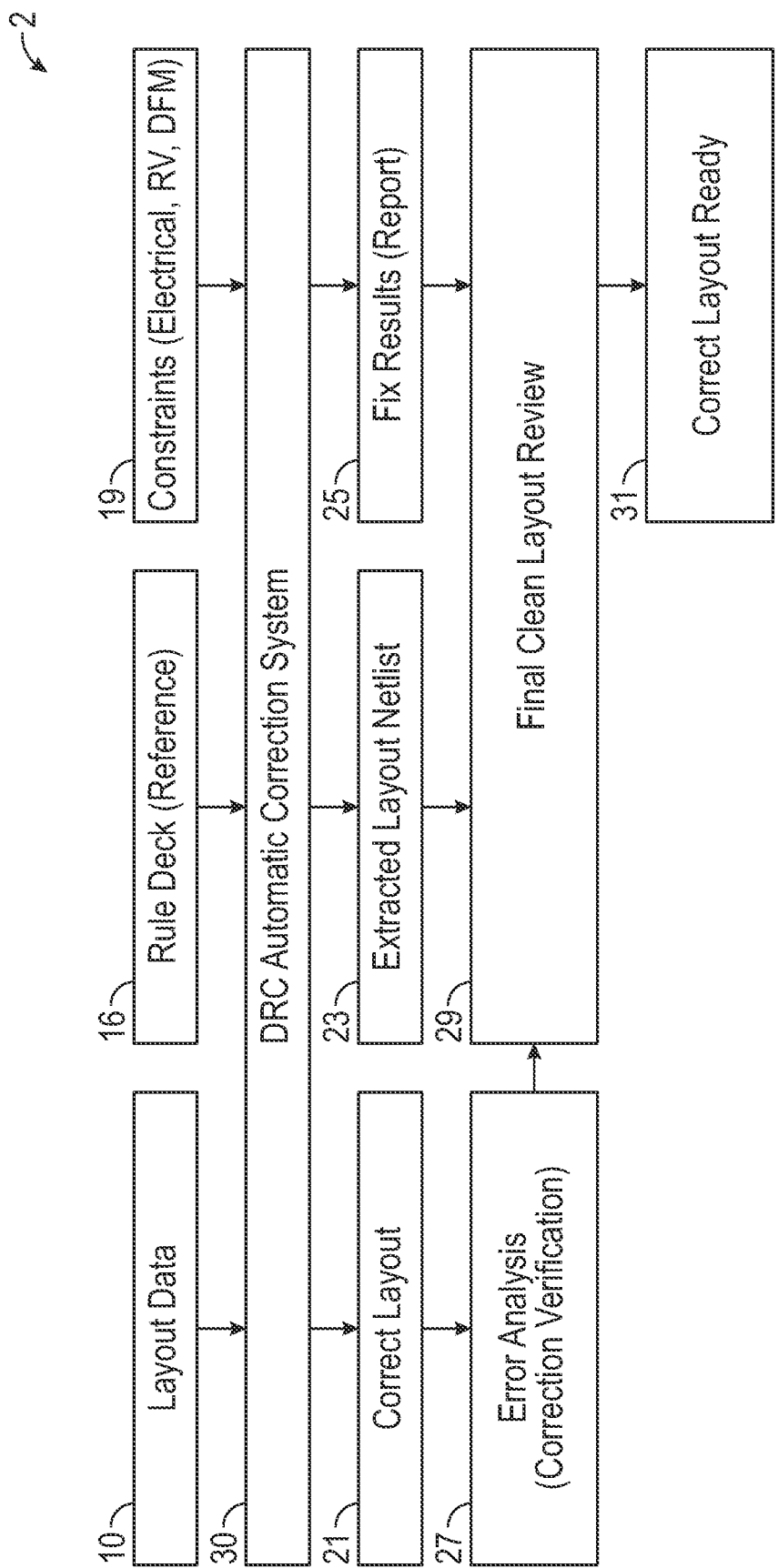
FIG. 8 is a process flow diagram of an exemplary system for maintaining mask layout electrical connectivity, reliability verification, and design for manufacturing structural correctness of a mask layout block in accordance with the present disclosure.
Figure 9:
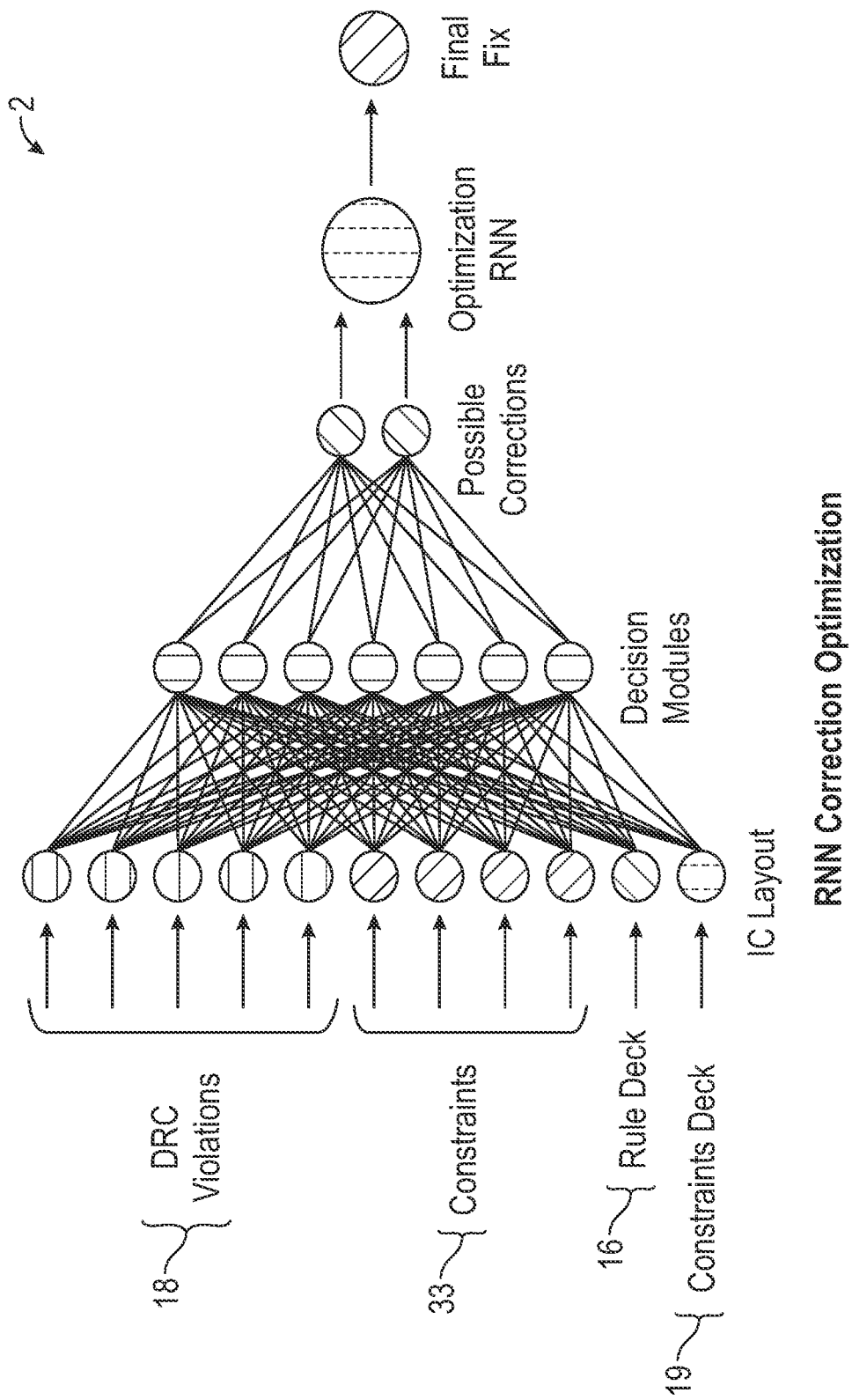
FIG. 9 is a schematic of an exemplary embodiment of a system for maintaining mask layout electrical connectivity, reliability verification, and design for manufacturing structural correctness of a mask layout block in accordance with the present disclosure.

Turning to FIGS. 8-9, exemplary systems 2 for maintaining mask layout electrical connectivity, reliability verification, and design for manufacturing structural correctness of a mask layout block feature a design rule auto-correction tool 30. The tool 30 reads all layout polygons, measures distances, widths, lengths, relative distances, ratios, and inter-layers relations. The design rule auto-correction tool 30 compares feature dimensions 12 in a mask layout data file 10 with a design rule 14 in a reference rule file 16. If a feature dimension 12 does not match the design rule 14, the tool identifies a design rule violation 18 and automatically corrects the design rule violation by adjusting or modifying the feature dimension 12 so it matches the design rule 14. In exemplary embodiments, the design rule auto-correction tool 30 includes an Advise Mode 1050, in which the tool highlights the design rule violation 18 without correcting it.

A design rule violation report serves as an input for the tool 30. The tool 30 reads the design rule violation report, which could be produced by a third-party tool or be generated by the design rule auto-correction tool 30. The second input is a process design rule deck file 16, which includes a numerical description of all layers, their relations, and their design rules. This may be the reference for the automatic correction.

Another optional input for the design rule auto-correction tool 30 is an electrical current analysis data file 19, which typically is generated by electrical simulation tools and contains information on constraints 33, e.g., electrical, RV, DFM. In this node each electrical node current is defined. This data can be fed into the tool 30 to maintain the electrical characteristics of the overall circuitries. The tool 30 takes these current constraints into account to maintain the circuits' behavioral and featured characteristics. A reliability data file can be provided as another input for the tool 30. In this rule deck file there are allowable currents for polygons at risk of physical reliability like electromigration or self-heat phenomenon. The design rule auto-correction tool 30 takes this data into account in order to maintain the overall circuitries' electrical reliability and sustainability.

Based on the design rule violation report and all related rule decks reference mentioned above, the design rule auto-correction tool 30 processes the IC layout data, modifying, moving, removing, re-creating to correct design rule violations, including hierarchical types which may occur between sub cells. The system may shift sub-cells, modify their polygons, and grow or shrink their size. All these operations can be done without damaging the electrical connectivity (i.e., maintaining the wires' connections and hookups), or damaging reliability constraints (i.e., keeping wires' correct width [Compensating if needed], length, number of vias and similar), or damaging design for manufacturing constraints (DFM, i.e., distances between wires, polygons widths or any other DFM related design rule). The design rule auto-correction tool 30 also may generate an extracted layout netlist 23 and a report 25 on fixing the results. After the system 2 performs the requisite error analysis 27, or correction verification, a final clean layout review 29 is done and the correct layout is ready 31.

One of the most significant advantages of disclosed embodiments is that the automatic corrections of design rule violations 18 in the mask layout data file 10 includes correcting all design rules, including dependency rules, producing the correct layout 21. With certain advanced chips, many design rules have dependencies. Thus, the correction process itself may create additional violations because correcting a particular design rule can create new design rule violations. Advantageously, disclosed systems and methods consider and fix all design rules, including dependencies rules that need to be covered. The capability of the systems and methods to see the "global picture" of the entire chip's layout (which can be very large) and fix all design rules, including their dependencies rules, on the fly is a significant innovation.

Exemplary embodiments perform auto-correction utilizing the ripple effect, which involves massively moving/editing/shifting/etc. numerous polygons at the same time and analyzing and fixing on-the-fly the mask layout block's data. Using the ripple effect, the system analyzes the mask layout block and takes all polygons' design rules into considering and solving a giant puzzle. In exemplary embodiments, it starts to work on the left-most corner of the block, moving/shifting/editing polygons as it progresses with the layout block. It might make a preliminary decision to start at the left-most corner of a block or it may cut the block to few virtual sub-blocks and work on all of them in parallel, then assemble them together. The decision where to start the analysis may be made using a successive approximation algorithm.

The ripple effect may be visually accessible to the designer. After pressing a "FIX" button, he/she may see rapidly, on screen, many polygons quickly shifting/moving/modified as the program takes into consideration numerous design rules to be obeyed. The user allows (Via setup GUI) the system to grow the layout block in the X or Y directions or both. Sometimes, a grow is needed due to lack of space. If the user doesn't allow automatic growth in any direction the program will flag visually on screen, using markers areas that were not fixed due to the "not enough room" limitation. The ripple effect may be achieved via a recurrent neural network (RNN) 45 and convolutional neural network (CNN) 32, as discussed in more detail herein.

Figure 10:
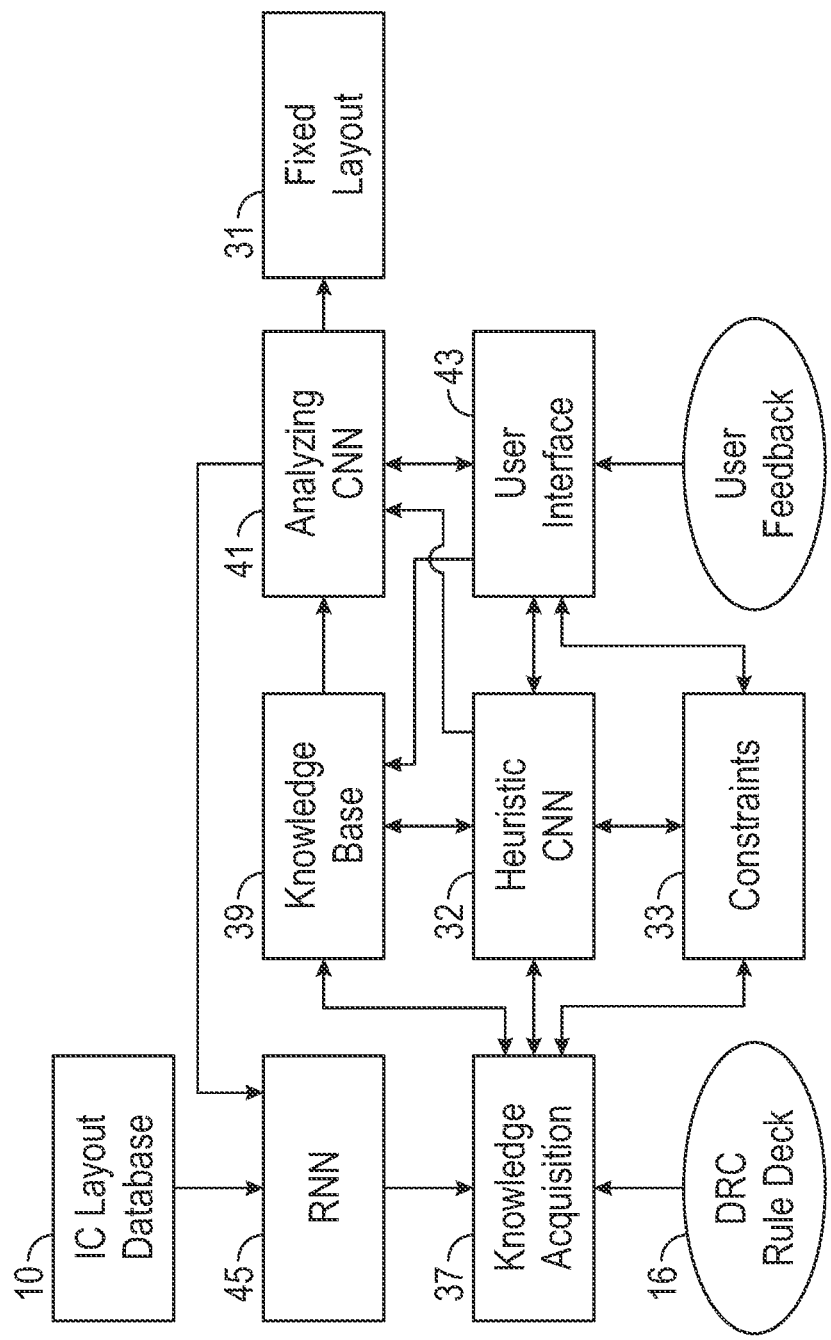
FIG. 10 is a process flow diagram of an exemplary design auto-correction tool in accordance with the present disclosure.
Figure 11:
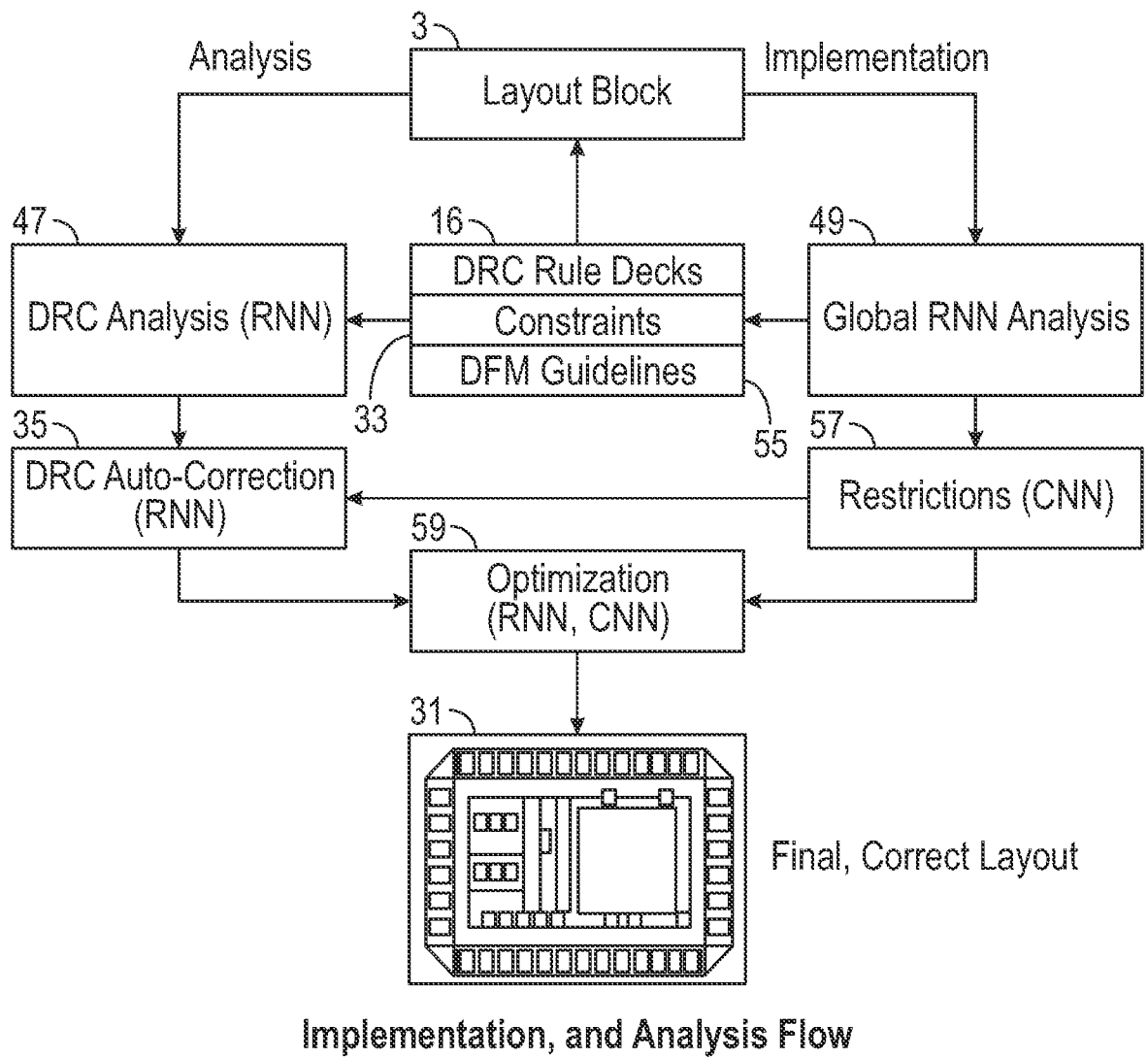
FIG. 11 is a process flow diagram of an exemplary embodiment of a system for maintaining mask layout electrical connectivity, reliability verification, and design for manufacturing structural correctness of a mask layout block in accordance with the present disclosure.

Referring to FIGS. 10 and 11, the design rule auto-correction tool 30 may include a convolutional neural network 32, which incorporates deep learning methods to perform fast and efficient data processing. A recurrent neural network 45 also may conduct design rule analysis 47 during the analysis phase and a global analysis 49 during implementation. Integrated circuit layout data typically is processed in segments, which is done according to a proprietary database splitting process. Heuristic processes work with computational geometry methods to create a successive approximation of derived layers to speed up the calculations and take all design rule dependencies into account. Especially with advanced nanometer processes there are thousands of design rule dependencies that need to be satisfied to meet the process manufacturing requirements. For example, a metal wire must have a different length if it runs more than a specific length or have to be in a different width if it has other wires near it.

The convolutional neural network 32 performs deep learning of the mask layout data file 10, analyzing for design rules, finding rules' correlations, and performing auto-correcting operations 35. By this deep learning, it acquires knowledge 37 about the required feature dimensions and design rules and develops a knowledge base 39 of this information. In exemplary embodiments, a recurrent neural network 45 is included in the system to help process knowledge inputs such as data from the mask layout data file 10.

The convolutional neural network 32 performs analysis 41 on the information. More particularly, it compares feature dimensions 12 in the mask layout data file 10 with design rules 14 in the reference rule file 16, identifies any design rule violations 18, and automatically corrects the design rule violations 18 to maintain electrical connectivity (LVS), reliability (RV) and manufacturing (DFM—Design for Manufacturing) rules correctness. The design rule analysis takes into account design rules from the design rule file 16, DFM guidelines 55, and other constraints 33. CNN 32 also analyzes certain restrictions 57 and communicates them to RNN 45 for design rule autocorrection. Optimization 59 may be performed by both the CNN 32 and the RNN 45. Ultimately, the system generates a fixed, correct mask layout 31.

Figure 12A:
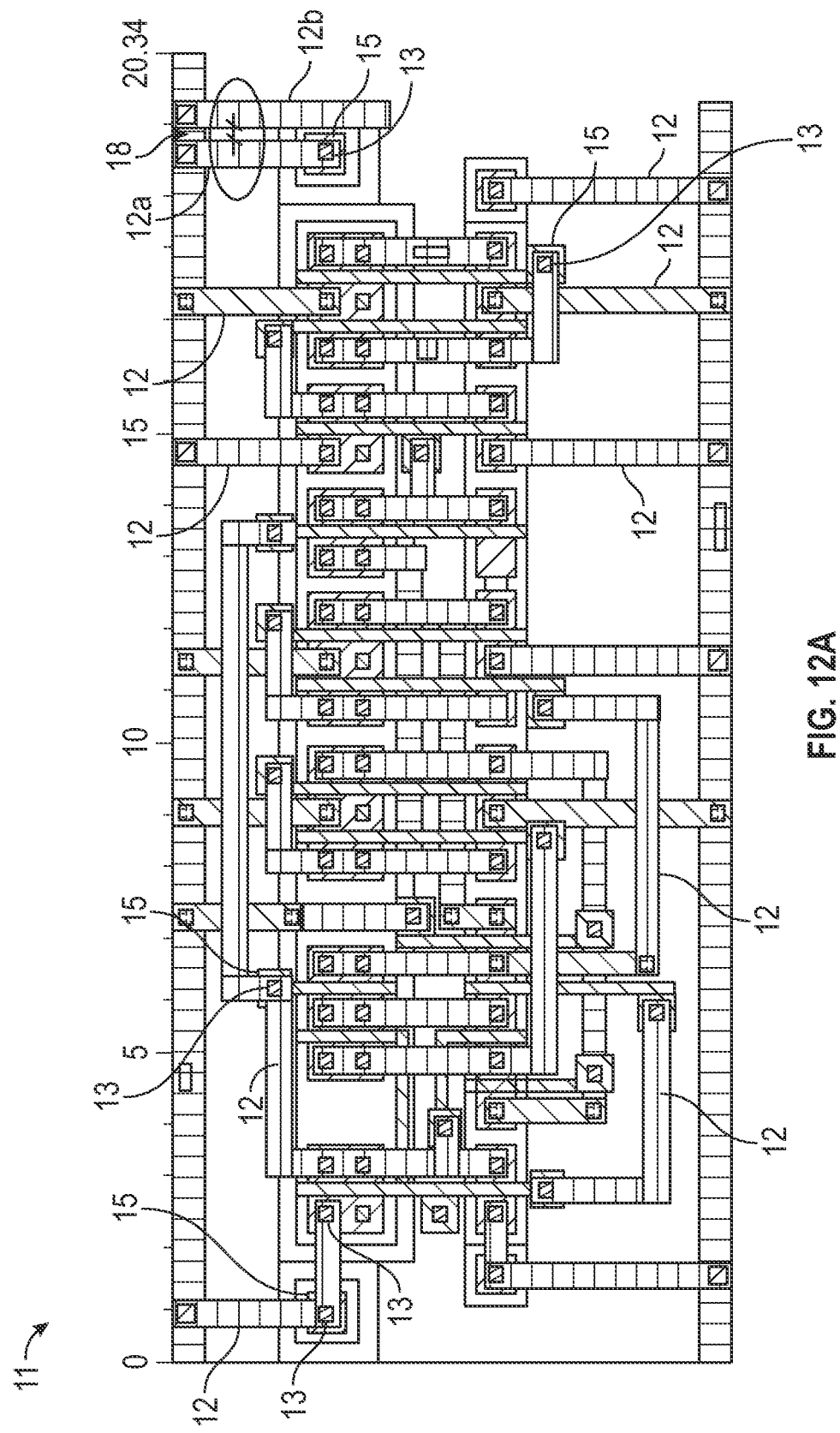
FIG. 12A is a layout view of an integrated circuit before an exemplary embodiment of a design rule auto-correction tool checks feature dimensions in a mask layout file.
Figure 12B:
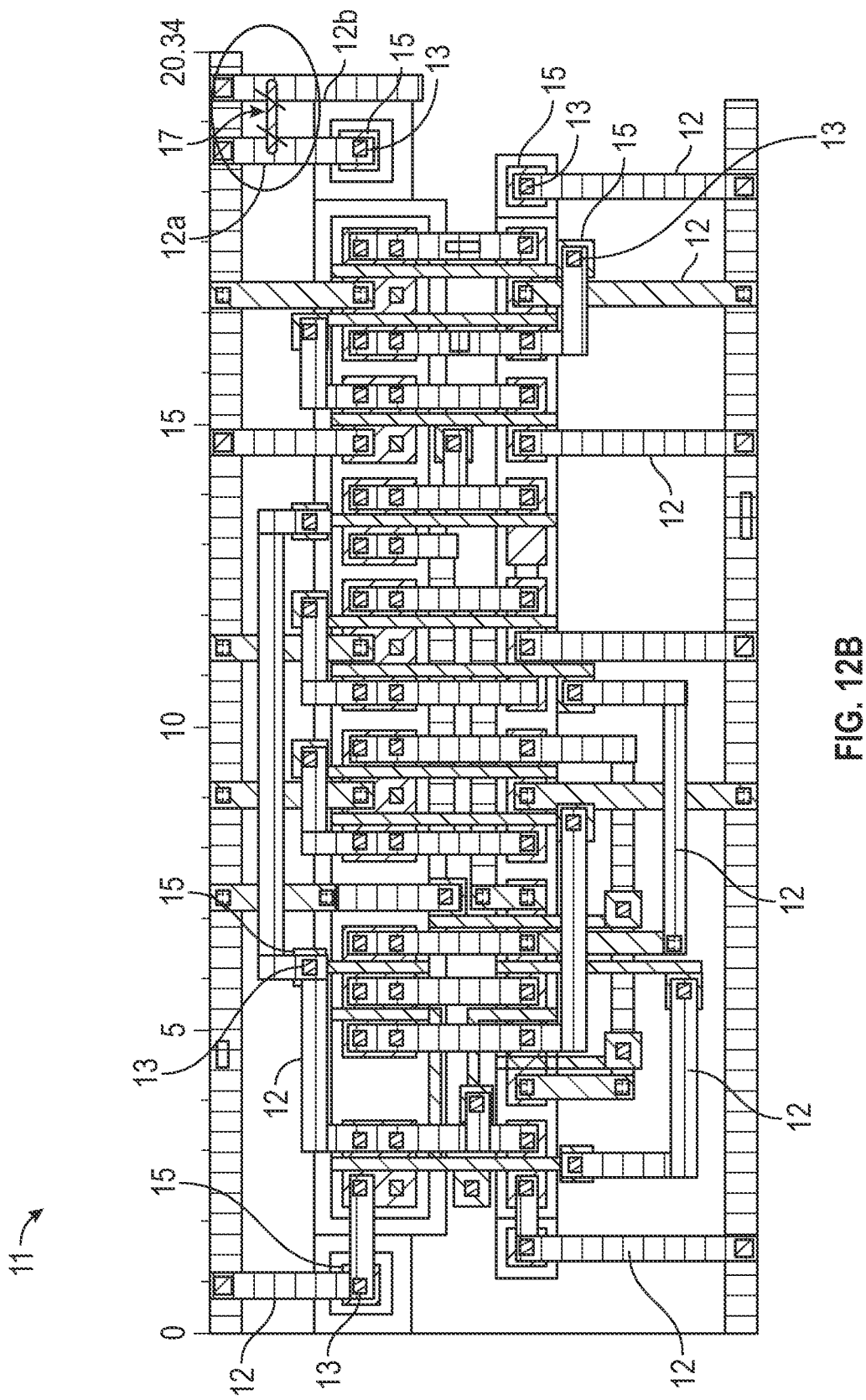
FIG. 12B is a layout view of an integrated circuit after an exemplary embodiment of a design rule auto-correction tool corrects design rule violations in a mask layout file.

FIGS. 12A and 12B illustrate another example of correcting a photomask assembly 11 using the auto-correction 35 and optimization 59 described above. The distance between polygon 12a and polygon 12b is less than the minimal distance 17, thereby creating a design rule violation 18 in an integrated circuit. FIG. 12B shows the mask layout after processing by disclosed methods and systems. The polygon 12a is now located the correct distance 17 from polygon 12b according to the design rule 14 deck file reference.

Figure 13:
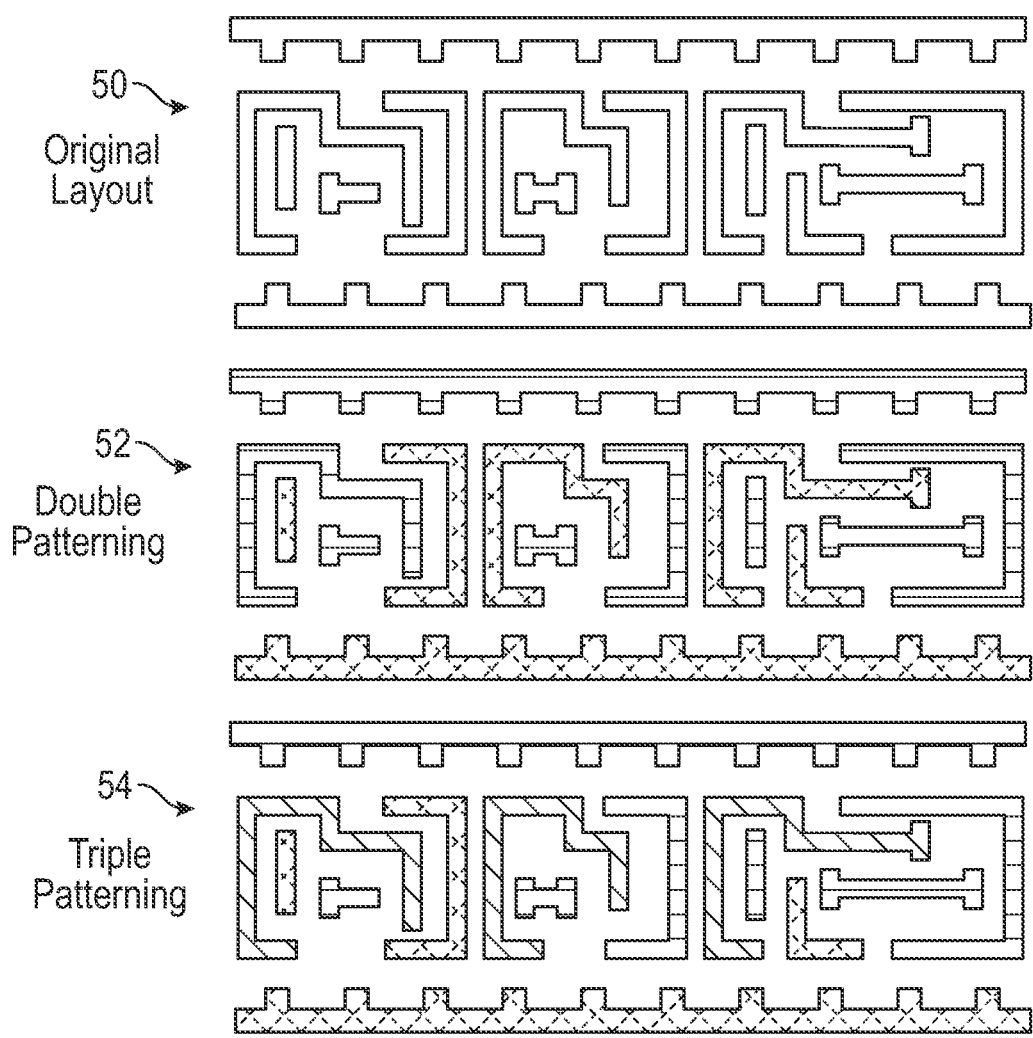
FIG. 13 is a schematic of an exemplary embodiment of a system and method for maintaining mask layout electrical connectivity, reliability verification, and design for manufacturing structural correctness of a mask layout block address an aspect of advanced chips called multi-patterning.

With reference to FIG. 13, exemplary embodiments address an aspect of advanced chips called multi-patterning. This concept introduces another high complexity challenge to fix geometrical design rules. Generally, multiple-patterning is creating layout polygons on top of each other. In FIG. 13, the chip's original layout 50 can be seen, as well as double patterning 52 and triple patterning 54. Typically, a microchip is built in multiple layers, isolated by an insulation layer. Using multiple layers allows manufacturers to add more circuitries on the silicon wafer. The systems and methods disclosed herein take into consideration the multiple patterning aspect and automatically correct all layout violations. In other words, these are multiple-patterning aware design rule auto correction systems.

It should be noted that a design rule typically defines the minimum or maximum or a geometrical combination allowable dimension for a feature fabricated on a specific layer. For example, an integrated circuit may include, among other layers, a polysilicon layer that forms the transistor gates, a metal layer that forms interconnects between transistors and a contact or via layer that connects the polysilicon layer to the metal layer. Each layer typically has at least one or more design rules associated with features in a mask layout file that are formed on the specific layer. The metal layer may include design rules for minimum, maximum or dependent allowable spacing between two or more adjacent metal features, minimum width of a metal feature and minimum and/or maximum length of a metal feature. The polysilicon and contact layers may include similar design rules where the minimum or maximum allowable dimensions are unique to that layer.

Thus, a microchip, especially an advanced one, is built with many hierarchies to make things faster. Typically, a designer starts with building a small block, then places it in another one, adds more circuits around it and places it into another one, and so forth. A complete layout of a full chip can have around 100 levels of hierarchy or more. Each block has to go through the same sets of design rule checks and other checks. Thus, it is extremely complicated to fix violations between hierarchies since there may be not enough space, and other considerations.

Figure 14A:
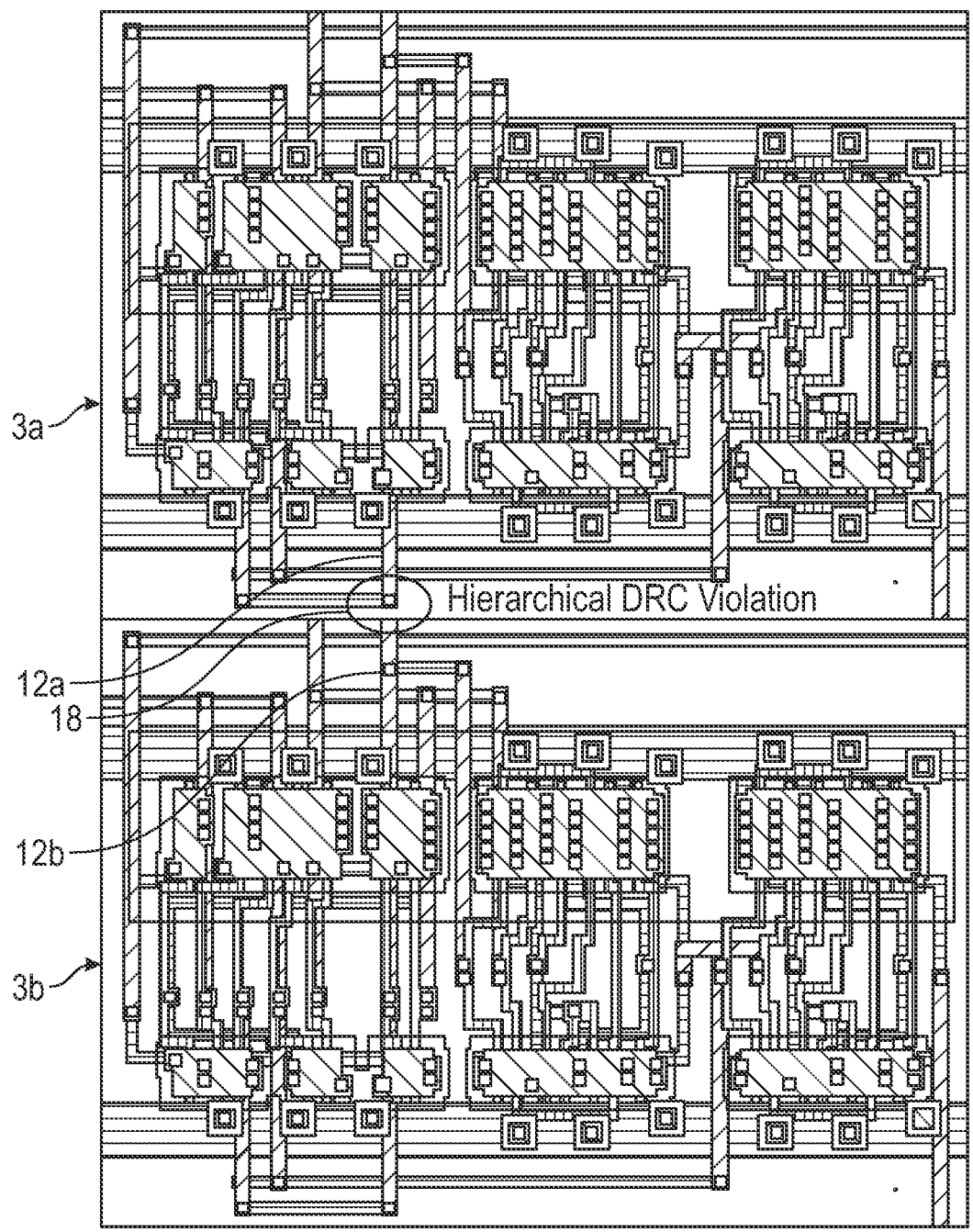
FIG. 14A is a schematic of exemplary connected mask layout blocks showing a hierarchical design rule violation in accordance with the present disclosure.
Figure 14B:
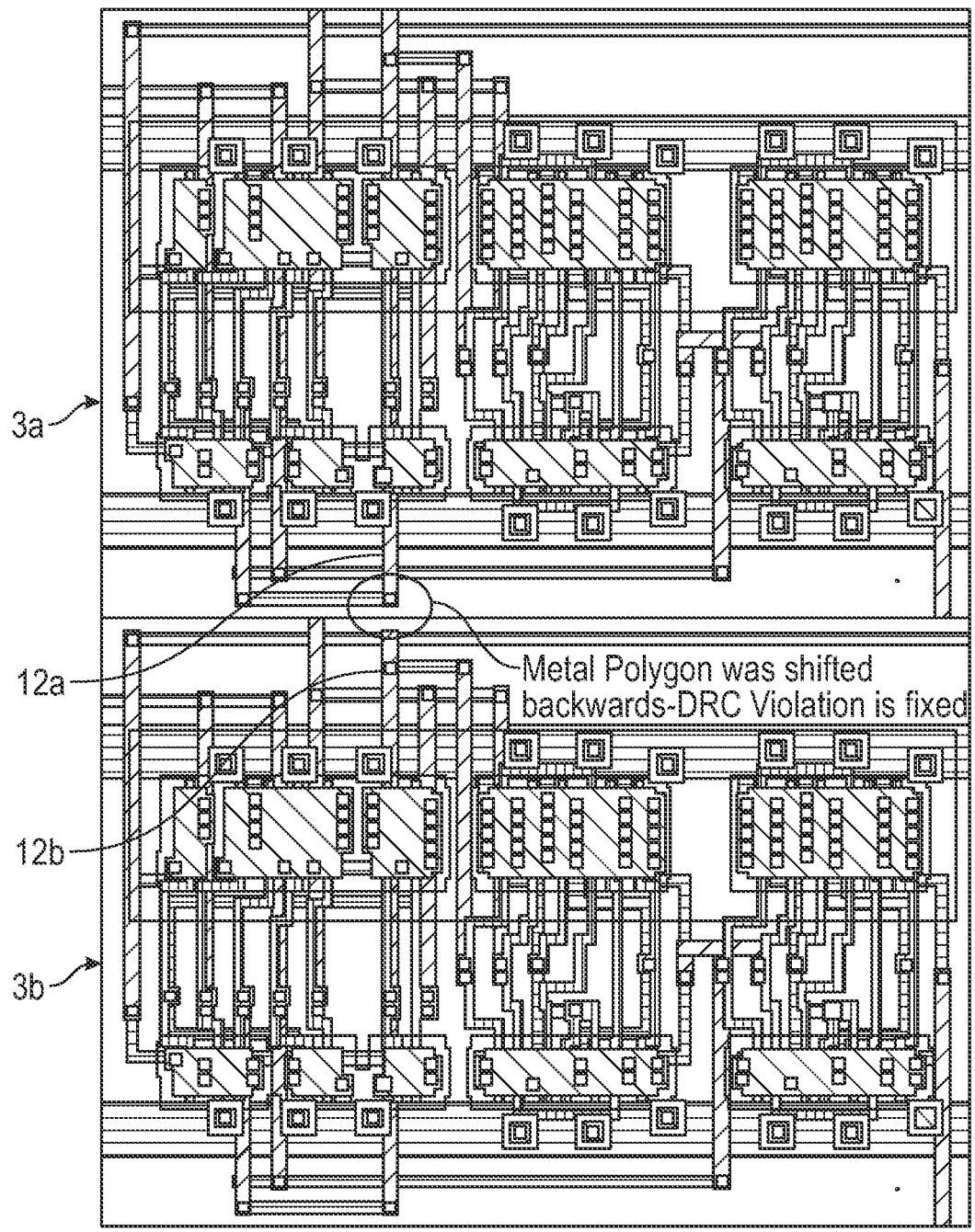
FIG. 14B is a schematic of the connected mask layout blocks of FIG. 14A showing an exemplary correction of the hierarchical design rule violation in accordance with the present disclosure.
Figure 14C:
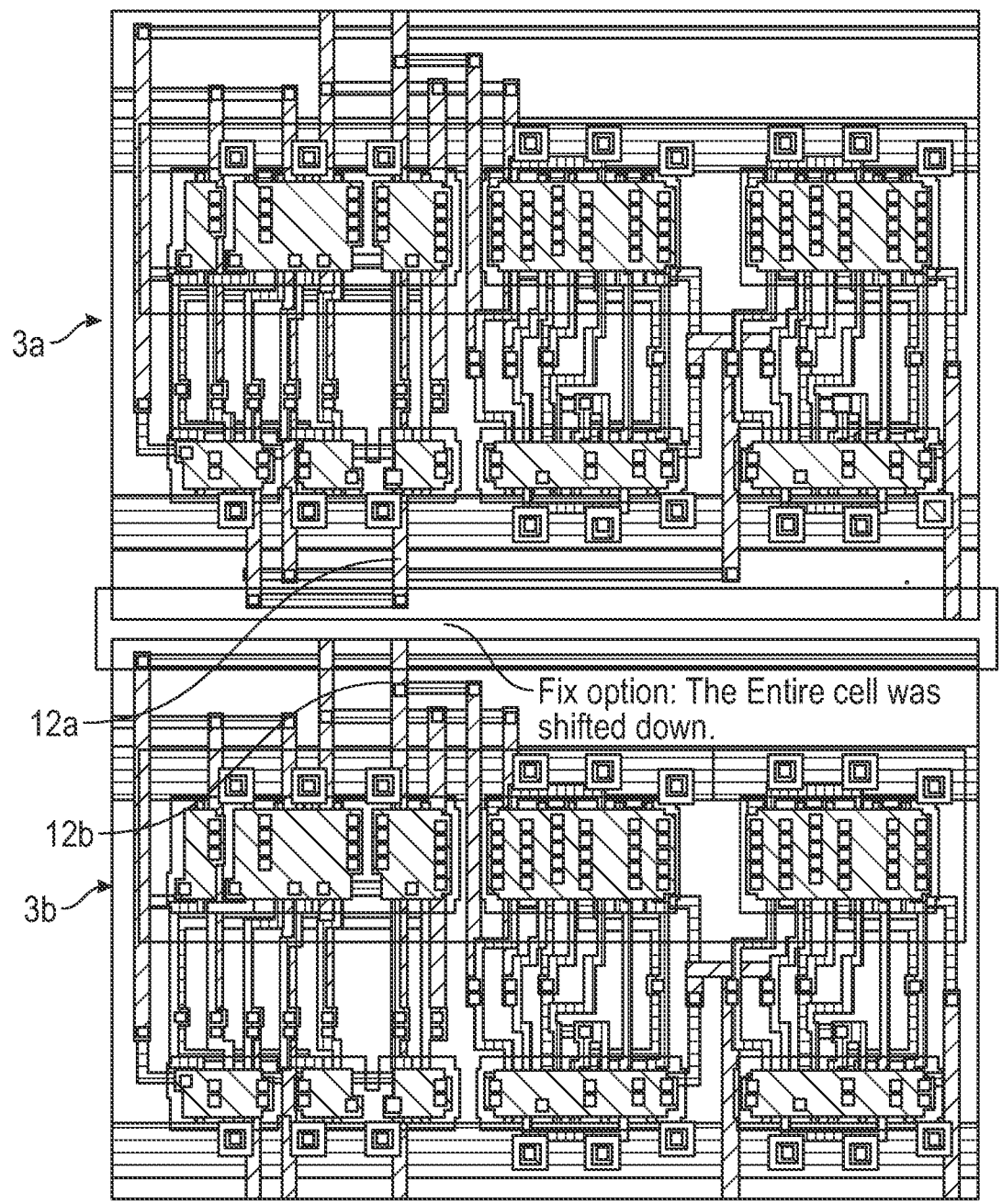
FIG. 14C is a schematic of the connected mask layout blocks of FIG. 14A showing an exemplary correction of the hierarchical design rule violation in accordance with the present disclosure.

Turning now to FIGS. 14A-14C, disclosed systems and methods advantageously identify and correct hierarchical design rule violations in these different layers and sub-cells automatically, saving months of manual human fixing. An exemplary method performs auto-correction on a hierarchical photo mask layout assembly defined by connected sub-mask layout blocks 3. The steps may include comparing a feature dimension 12 in at least one instance of a sub-cell or sub-mask layout block 3b in a mask layout file 10 with a design rule 14 in a reference rule file 16 and identifying a hierarchical design rule violation 18 in one or more instances of a sub-cell 3b in the mask layout file 10 if the feature dimension 12 is less or greater than the design rule 14.

A hierarchical design rule violation 18 is a dimension-sized violation when two layout blocks 3a, 3b are placed near each other. The solution is a hierarchical geometrical fix. Layout blocks are made individually, cleaned for design rules, and assembled together. Even if the blocks themselves are DRC clean, i.e., design rule violations=0, just placing them together can create a situation where some polygons are too close to others, which then creates a hierarchical DRC violation. An example of such a situation is shown in FIG. 14A, where a hierarchical DRC violation 18 occurs because polygon 12a of cell or layout block 3a is too close to polygon 12b of sub-cell or layout block 3b. In other words, a hierarchical violation 18 was created by the operation of putting two base cells together.

In such situations, disclosed systems and methods go into the blocks and shift polygons inside them to eliminate the violation 18. In this first auto-fix option, illustrated in FIG. 14B, the system stretched the polygon 12b away from polygon 12a, so the two polygons are no longer too close to each other. This option may be chosen by the system for this type of fix since it doesn't consume more space and utilizes the existing space. It should be noted that exemplary systems and methods automatically evaluate many options to fix the layout and choose the optimal solution in order not to grow the layout block or the cell or damage other of its characteristics like electrical connectivity, DFM and Reliability. In exemplary embodiments, space is the highest priority in such an evaluation. This is because growing the block means more real estate on the silicon, which would result in fewer chips on the same silicon. Other considerations relate to the chip's functionality, e.g., electrical connectivity If necessary, the system also slightly shifts one or both blocks 3a, 3b away from each other to eliminate the violation 18. Such a process is very complex; as blocks grow each one can contain hundreds of millions of polygons. An example of this second auto-fix option is shown in FIG. 14C, where the system shifts the lower block 3b down and away from the upper block 3a, creating larger space between polygons 12a and 12b and eliminating the hierarchical DRC violation 18. This solution probably would not be chosen in this instance because it would unnecessarily take up extra space on the silicon.

Thus, exemplary embodiments work on interconnecting layers, automatically correcting geometrical design rules of mask layout file including individual polygons, instances of a sub-cells and all other mask layout objects. Then the design rule violation 18 is automatically corrected in each instance of the sub-cells, possibly including the top-level cell or assembly block and the corresponding interconnect layers. Disclosed systems and methods also offer settings to enable cell or sub-cell growth in the X and/or Y direction in case there is not enough room to correct the design rule violations.

In exemplary embodiments, disclosed systems and methods work in parallel processing and may split the processing over numerous CPUs/GPSs over a network. This advantageously achieves higher processing speed. Disclosed embodiments also work incrementally, which means processing only the changed data since the previous run or last set of modifications. This feature saves a significant amount of time.

Exemplary systems and methods can be launched via a graphical user interface (GUI) 43 and background batch process. Design rule violations can be presented graphically 1060 as violation markers within the mask layout editor native environment. The system may include a violation browser to show each design rule violation, offering the option to automatically correct each one individually to the correct process design rule.

Exemplary embodiments advantageously support FinFet manufacturing process geometrical design rules, maintaining electrical, reliability and DFM rules correctness. Disclosed embodiments also support Digital, Analog, AMS (Analog-Mixed Signal Design) and MEMs mask layout types. The systems and methods can be integrated with existing mask layout, industry standard editors via scripting languages.

Thus, it is seen that systems and methods for eliminating geometrical design rule violations of a mask layout block and maintaining mask layout electrical connectivity, reliability verification, and design for manufacturing structural correctness of a mask layout block are provided. It should be understood that any of the foregoing configurations and specialized components or connections may be interchangeably used with any of the systems of the preceding embodiments. Although illustrative embodiments are described hereinabove, it will be evident to one skilled in the art that various changes and modifications may be made therein without departing from the scope of the disclosure. It is intended in the appended claims to cover all such changes and modifications that fall within the true spirit and scope of the present disclosure.

What is claimed is:

1. A computer-implemented method of eliminating geometrical design rule violations of a mask layout block, comprising:
    comparing a feature dimension in a mask layout data file with a reliability verification-aware design rule in a reference rule file, the feature dimension being dependent on reliability constraints including one or more of: electromigration, self-heat, and IR drop;
    identifying a design rule violation of a mask layout block if the feature dimension does not match the reliability verification-aware design rule; and
    automatically correcting the design rule violation by modifying the feature dimension such that the feature dimension matches the reliability verification-aware design rule, matches dependency rules, and maintains reliability verification.

2. The method of claim 1 wherein identifying a design rule violation comprises determining that the feature dimension in the mask layout data file is greater or smaller than the reliability verification-aware design rule in the reference rule file.

3. The method of claim 1 wherein modifying the feature dimension such that the feature dimension matches the reliability verification-aware design rule comprises adjusting the feature dimension until the feature dimension is exactly equal to the reliability verification-aware design rule.

4. The method of claim 1 wherein the design rule further comprises one or more of: a Voltage-Aware design rule or a DFM-Aware design rule.

5. The method of claim 1 further comprising presenting the design rule violation graphically as one or more violation markers.

6. The method of claim 1 wherein the design rule violation is a hierarchical design rule violation in a sub-cell of the mask layout data file.

7. The method of claim 1 further comprising generating a clean mask layout data file without any design rule violations.

8. A system for maintaining mask layout electrical connectivity, reliability verification, and design for manufacturing structural correctness of a mask layout block, comprising:
    a design rule auto-correction tool including a convolutional neural network, the design rule auto-correction tool being configured to compare a feature dimension in a mask layout data file with a design rule in a reference rule file;
    input for the design rule auto-correction tool including a reliability data file containing reliability data;
    wherein the design rule auto-correction tool takes into account the reliability data to comply with electrical reliability constraints;
    wherein if the feature dimension does not match the design rule, the design rule auto-correction tool identifies a design rule violation and automatically corrects the design rule violation by modifying the feature dimension such that the feature dimension matches the design rule; and
    wherein the convolutional neural network creates a successive approximation of derived layers to take all design rule dependencies into account, and if the modification of the feature dimension to correct the design rule violation would create an additional design rule violation the design rule violation auto-correction tool automatically corrects the additional design rule violation.

9. The system of claim 8 wherein the convolutional neural network performs deep learning of the mask layout data file.

10. The system of claim 8 wherein the convolutional neural network compares the feature dimension in the mask layout data file with the design rule in the reference rule file, identifies the design rule violation, and automatically corrects the design rule violation.

11. The system of claim 8 wherein the design rule auto-correction tool reduces size and increases density of features in the mask layout data file.

12. The system of claim 8 wherein the design rule auto-correction tool determines if spacing between polygons in the mask layout data file is greater than spacing in a minimum design rule and is configured to reduce the spacing between polygons until the spacing is equal to the spacing in the minimum design rule.

13. The system of claim 8 further comprising a violation browser displaying the design rule violation.

14. The system of claim 8 wherein the design rule auto-correction tool considers multiple patterning and automatically corrects all design rule violations on multiple layers of an integrated circuit.

15. The system of claim 8, wherein the system supports FinFet manufacturing process rules and digital, analog, analog-mixed signal design, and MEMs mask layout types.

16. The system of claim 8 wherein the reliability data file further contains allowable currents for polygons at risk of physical reliability.

17. A method of analyzing an integrated circuit mask layout data file and a reference rule file, comprising:
    reading a mask layout data file;
    reading a reference rule file;
    comparing a feature dimension in the mask layout data file with a reliability verification-aware design rule in the reference rule file, the feature dimension being dependent on reliability constraints including one or more of: electromigration, self-heat, and IR drop;

identifying a design rule violation in the mask layout data file if the feature dimension does not match the reliability verification-aware design rule;

determining the coordinates of the design rule violation in the mask layout data file; and automatically correcting the design rule violation by modifying the feature dimension such that the feature dimension matches the reliability verification-aware design rule.

18. The method of claim 17 wherein modifying the feature dimension such that the feature dimension matches the reliability verification-aware design rule comprises adjusting the feature dimension until the feature dimension is greater than or equal to the reliability verification-aware design rule.

19. The method of claim 17 further comprising analyzing interconnecting layers of a plurality of mask layout blocks, the interconnecting layers including a top-level cell and one or more sub-cells.

20. The method of claim 19 wherein identifying a design rule violation in the mask layout data file comprises identifying a design rule violation in one or more of the top-level cell or the one or more sub-cells and automatically correcting the design rule violation comprises automatically correcting the design rule violation in one or more of the top-level cell or the one or more sub-cells.

21. The method of claim 17 wherein the reading, comparing, identifying, determining, and automatically correcting steps are performed incrementally on mask layout data that has changed since a previous run.

22. The method of claim 17 wherein the design rule further comprises one or more of: a Voltage-Aware design rule or a DFM-Aware design rule.

* * * * *